US011706986B2

(12) United States Patent
Tada et al.

(10) Patent No.: US 11,706,986 B2
(45) Date of Patent: Jul. 18, 2023

(54) THERMOELECTRIC MATERIAL

(71) Applicants: Mitsuba Corporation, Gunma (JP); National Institute for Materials Science, Ibaraki (JP)

(72) Inventors: Satoki Tada, Kiryu (JP); Yukihiro Isoda, Tsukuba (JP)

(73) Assignees: Mitsuba Corporation, Gunma (JP); National Institute for Materials Science, Ibaraki (JP)

( * ) Notice: Subject to any disclaimer, the term of this patent is extended or adjusted under 35 U.S.C. 154(b) by 375 days.

(21) Appl. No.: 16/336,547

(22) PCT Filed: Oct. 5, 2017

(86) PCT No.: PCT/JP2017/036331
§ 371 (c)(1),
(2) Date: Mar. 26, 2019

(87) PCT Pub. No.: WO2018/066657
PCT Pub. Date: Apr. 12, 2018

(65) Prior Publication Data
US 2021/0280759 A1 Sep. 9, 2021

(30) Foreign Application Priority Data
Oct. 6, 2016 (JP) .................................. 2016-198206

(51) Int. Cl.
*H10N 10/853* (2023.01)
*H10N 10/851* (2023.01)
(52) U.S. Cl.
CPC ......... *H10N 10/853* (2023.02); *H10N 10/851* (2023.02)

(58) Field of Classification Search
CPC ......... H01L 35/14; H01L 35/18; H01L 35/26; H10N 10/851; H10N 10/853
See application file for complete search history.

(56) References Cited

U.S. PATENT DOCUMENTS 7,002,071 B1* 2/2006 Sadatomi ................ H01L 35/34
136/238
2010/0051081 A1* 3/2010 Iida ...................... C04B 35/6265
136/240

FOREIGN PATENT DOCUMENTS

JP 2007146283 A 6/2007
JP 4726452 B 7/2011
(Continued)

OTHER PUBLICATIONS

Bashir, Mohamed Bashir Ali, et al., "Recent advances on Mg2Si1-xSnx materials for thermoelectric generation"; Renewable and Sustainable Energy Reviews 37 (2014) pp. 569-584. (Year: 2014).*

(Continued)

*Primary Examiner* — Tamir Ayad
(74) *Attorney, Agent, or Firm* — Wood Herron & Evans LLP

(57) ABSTRACT

The present invention provides a thermoelectric material excellent in heat resistance with less degradation of thermoelectric characteristics even in a high temperature environment. The thermoelectric material comprises a compound represented by a chemical formula $Mg_2Si_{1-x}Sn_x$ ($0<x<1$) wherein at least one of the Si site and the Sn site of the compound is replaced with at least one of Sb and Bi, and an added Fe.

4 Claims, 11 Drawing Sheets

(56) References Cited

FOREIGN PATENT DOCUMENTS

| JP | 4726747 B | 7/2011 |
| JP | 2013008747 A | 1/2013 |
| JP | 2015145512 A | 8/2015 |
| JP | 2017098288 A | 6/2017 |
| JP | 2017195339 A | 10/2017 |
| WO | 2016030964 A1 | 3/2016 |

OTHER PUBLICATIONS

Tsai, Tzu-Hsuan, et al, "Metal removal from silicon sawing waste using the electrokinetic method", Journal of the Taiwan Institute of Chemcial Engineers, 40 (2009), pp. 1-5. (Year: 2009).*
Riffel, Michael; Schilz, Jurgen; "Mechanically alloyed $Mg_2Si_{1-x}Sn_x$ solid solutions as thermoelectric materials", 15th International Conference on Thermoelectrics, pp. 133-136. (Year: 1996).*
PCT Office, International Search Report issued in PCT/JP2017/036331 dated Dec. 12, 2017, 4 pages.
Japanese Patent Office, Office Action issued in JP 2018-543967 dated Apr. 21, 2020, 9 pages.

* cited by examiner

THERMOELECTRIC MATERIAL

TECHNICAL FIELD

The present invention relates to a thermoelectric material.
Priority is claimed based on Japanese Patent Application No. 2016-198206 filed in Japan on Oct. 6, 2016, the content of which is hereby incorporated by reference.

BACKGROUND ART

Thermoelectric conversion uses the Seebeck effect and the Peltier effect to interconvert thermal energy and electric energy. Thermoelectric conversion attracts attention as a technology for efficiently utilizing energy. A thermoelectric material for thermoelectric conversion, which is a material capable of interconverting thermal energy and electric energy, is used.

As thermoelectric materials, materials such as Mg—Si—Sn based materials, Bi—Te based materials, Pb—Te based materials and the like are known (see, for example, Patent Documents 1 and 2). Bi—Te based materials and Pb—Te based materials use elements with high scarcity and hazard. Therefore, Bi—Te based materials and Pb—Te based materials are expensive and require careful handling. On the other hand, the Mg—Si—Sn based materials do not use elements with high scarcity and hazardous properties, so the materials are excellent in cost and safety.

[Patent Document 1] Japanese Patent No. 4726452
[Patent Document 2] Japanese Patent No. 4726747

DISCLOSURE OF THE INVENTION

Performance of a thermoelectric material is evaluated by a dimensionless figure-of-merit ZT expressed as the product of the figure-of-merit Z and an absolute temperature T. Therefore, depending on the value of the figure-of-merit Z, high thermoelectric characteristics are generally obtained in the high temperature region. Therefore, as an actual mode of use, it is assumed to be used in a high-temperature region excellent in thermoelectric characteristics. However, sufficient consideration has not been given to the effect on the thermoelectric characteristics when the thermoelectric material is continuously used in a high temperature region.

The present invention has been made in view of the above circumstances, and it is an object thereof is to provide a thermoelectric material excellent in heat resistance with less degradation of thermoelectric characteristics even in a high temperature environment.

The present inventors investigated the influence on the thermoelectric characteristics when heat treatment was applied to the thermoelectric material. As a result, it was found that the thermoelectric characteristics of the Mg—Si—Sn based material are deteriorated by heat treatment. Therefore, as a result of further investigation, it was found that the addition of iron (Fe) to the Mg—Si—Sn system material can suppress the degradation of thermoelectric characteristics by heat treatment.

That is, the present invention employs the following means.

(1) A thermoelectric material, which includes:
a compound represented by a chemical formula $Mg_2Si_{1-x}Sn_x$ (0<x<1) wherein at least one of the Si site and the Sn site of the compound is replaced with at least one of Sb and Bi, and
an added Fe.

(2) The thermoelectric material according to (1), wherein the additive amount of the Fe is not more than an amount that causes no phase transition of the compound.

(3) The thermoelectric material according to (1), wherein an additive amount of the Fe is 5000 ppm or more and 50000 ppm or less. 4.

(4) The thermoelectric material according to any one of (1) to (3), wherein an additive amount of a substitution element replacing at least one of the Si site and the Sn site is 1000 ppm or more and 30000 ppm or less.

(5) The thermoelectric material according to (4), wherein the substitution element replacing at least one of the Si site and the Sn site is Sb, and the additive amount of Sb is 5000 ppm or more.

(6) The thermoelectric material according to (4), wherein the substitution element replacing at least one of the Si site and the Sn site is Bi, and the additive amount of Bi is 1000 ppm or more and 15000 ppm or less.

(7) The thermoelectric material according to any one of (1) to (6), wherein the range of x in the chemical formula is 0.25≤x<0.75.

According to the thermoelectric material of the above aspect, it is possible to provide a thermoelectric material excellent in heat resistance with less degradation of thermoelectric characteristics even under a high temperature environment.

DETAILED DESCRIPTION OF THE INVENTION

Figure 1:
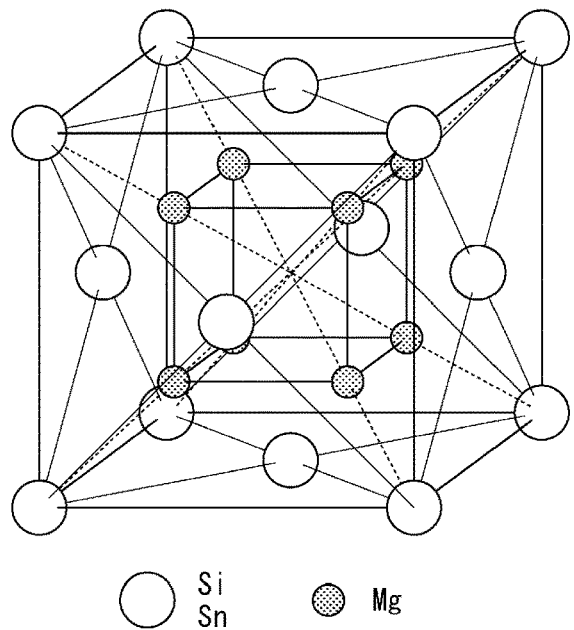
FIG. 1 shows a crystal structure of a compound represented by the chemical formula $Mg_2Si_{1-x}Sn_x$ (0<x<1).

Hereinafter, the configuration of the present embodiment will be described based on the drawings. In the drawings used in the following description, in order to make the features easy to understand, there are cases where the characteristic portions are enlarged for the sake of convenience, and the dimensional ratios of the respective components are not necessarily the same as the actual ones. The materials, dimensions, and the like exemplified in the following description are merely examples, and the present invention is not limited thereto, and it is possible to carry out the invention by appropriately changing and modifying them within the scope not changing the gist thereof.

Thermoelectric Materials

The thermoelectric material according to this embodiment contains a compound represented by a chemical formula $Mg_2Si_{1-x}Sn_x$ (0<x<1) wherein at least one of a silicon (Si) site and a tin (Sn) site of the compound is replaced with at least on of an antimony (Sb) and a bismuth (Bi). The thermoelectric material further contains an added Fe.

FIG. 1 shows a crystal structure of a compound represented by the chemical formula $Mg_2Si_{1-x}Sn_x$ (0<x<1). $Mg_2Si_{1-x}Sn_x$ (0<x<1) is a solid solution of $Mg_2Si$ and $Mg_2Sn$. $Mg_2Si_{1-x}Sn_x$ (0<x<1) is a ternary compound having a reverse fluorite structure shown in FIG. 1.

The chemical formula $Mg_2Si_{1-x}Sn_x$ (0<x<1) is described as a stoichiometric composition ratio. In an actual compound, some compositional deviation in crystal structure is permitted. For example, a range of Mg may be in a range of 1.98 or more and 2.01 or less.

Since the compound is a ternary system, a range of x in the chemical formula $Mg_2Si_{1-x}Sn_x$ is 0<x<1. The range of x is preferably be a 0.25<x<0.75, more preferably 0.35<x<0.65, and even more preferably 0.4<x<0.6. If x is in the above-mentioned range, $Mg_2Si$ and $Mg_2Sn$ are easily dissolved. That is, it is easy to obtain a solid solution represented by the chemical formula $Mg_2Si_{1-x}Sn_x$.

In the thermoelectric material according to this embodiment, at least one of Si site and Sn site of the compound is replaced with at least one of Sb and Bi.

Si and Sn are generally tetravalent. In contrast, Sb and Bi are pentavalent. Therefore, when at least one of the Si site and the Sn site is replaced with at least one of Sb and Bi, electrons are injected into the compound. Since electrons function as carriers within the compound, an electrical resistivity of the thermoelectric material is reduced. As the electrical resistivity of the thermoelectric material decreases, a thermoelectric characteristic of the thermoelectric material is improved.

Here, the thermoelectric characteristic of the thermoelectric material is evaluated by a dimensionless figure-of-merit ZT. ZT is represented by the following general formula (1).

$$ZT = \alpha^2 T/\rho\kappa \quad (1)$$

α is a Seebeck coefficient, T is an absolute temperature, ρ is an electrical resistivity, and κ is a thermal conductivity.

The Seebeck coefficient α of the general formula (1) can be represented by the following formula (2).

$$\alpha = k_B(\log(N/n) + C)/e \quad (2)$$

Here, $k_B$ is a Boltzmann coefficient, e is an electric charge, C is a constant, and n is a carrier concentration.

N is represented by the following general formula (3).

$$N = \frac{1}{2} \times (2mk_B T/\pi h^2)^{3/2} \quad (3)$$

Here, $k_B$ is a Boltzmann coefficient, h is a Planck's constant, T is an absolute temperature, and m is an effective mass. That is, the Seebeck coefficient can be expressed as a function of a carrier concentration and an effective mass.

Both the Si site and the Sn site may be replaced, or one of them may be replaced. It is difficult to analyze exactly which site is replaced with an additive element.

The substitution element replacing the Si site and/or the Sn site may be either one of Sb and Bi, or may be both Sb and Bi.

An additive amount of the substitution element is preferably 1000 ppm or more and 30000 ppm or less, more preferably 1000 ppm or more and 15000 ppm or less, still more preferably 2500 ppm or more and 10000 ppm or less, and most preferably 2500 ppm or more and 7500 ppm or less.

If the additive amount of the substitution elements is too large, the substitution elements themselves or their compound may be metallically segregated in some cases. In addition, if the additive amount of the substitution elements is too small, it is difficult to sufficiently lower the electrical resistivity and it becomes difficult to realize a high thermoelectric performance. For example, as described in Patent Document 2, the thermoelectric characteristics of the thermoelectric materials are particularly excellent when the additive amount of the substitution elements is within the above range. This tendency is the same even if Fe is added as described later.

When the substitution element is Sb, an additive amount of Sb is preferably 5000 ppm or more, more preferably 5000 ppm or more and 15000 ppm or less, and even more preferably 7500 ppm. For example, as described in Patent Document 2, when the substitution element is Sb, it shows the maximum performance index at the additive amount of 7500 ppm. This tendency is the same even if Fe is added as described later.

Also if the substitution element is Bi, it is preferable that the additive amount of Bi 1000 ppm or more and 15000 ppm or more, more preferably 1000 ppm or more and 7500 ppm or less, and more preferably 2500 ppm or more and 7500 ppm or less. For example, as described in Patent Document 2, as compared with the case where the substitution element is Sb, when the substitution element is Bi, a high performance index is exhibited even with a small additive amount. This tendency is the same even if Fe is added as described later.

Here, the "additive amount of substitution element" means the amount of the substitution element (molar percentage of the substitution element with respect to the thermoelectric material) to be added in manufacturing the thermoelectric material. Substitution elements to be added when preparing thermoelectric materials are incorporated directly into the thermoelectric materials. Therefore, the "additive amount of substitution element" can also be said to be "content of substitution element".

Further, the thermoelectric material according to this embodiment contains an added Fe. It is not clear how the added Fe is present in the crystal structure.

When Fe is added, it is possible to prevent the electrical resistivity from increasing after the heat treatment, and it is possible to prevent deterioration of thermoelectric characteristics. The reason why the added Fe prevents an increase in the electrical resistivity after the heat treatment is not clear.

The additive amount of Fe is preferably not more than an amount in which the compound represented by the chemical formula $Mg_2Si_{1-x}Sn_x$ (0<x<1) does not cause a phase transition, preferably 5000 ppm or more and 50000 ppm or less, and more preferably 10,000 ppm or more and 30,000 ppm or less.

Here, the phase transition means that the crystal structure changes. That is, "not causing a phase transition" means that the compound represented by the chemical formula $Mg_2Si_{1-x}Sn_x$ (0<x<1) does not changed to a crystal structure of a second phase or a third phase by the addition of Fe. Also, "additive amount of iron" can also be said to be "iron content" in the same way as "additive amount of substitution element".

When the crystal structure partially changes at a portion, the thermoelectric characteristics of the portion change. On the other hand, when there remains a portion in which the compound has not caused phase transition due to segregation or the like by adding Fe even if an additive amount of Fe exceeds the amount causing the phase transition, the additive amount of Fe may exceeds the amount causing the phase transition.

According to the thermoelectric material of the present embodiment, it is possible to reduce deterioration of thermoelectric characteristics even under a high temperature environment. That is, the thermoelectric material according to this embodiment is excellent in heat resistance.

The thermoelectric material according to the present embodiment can be used, for example, in an n-type thermoelectric element (thermoelectric semiconductor) in a thermoelectric conversion device.

(Method of Manufacturing Thermoelectric Material)

Figure 2:
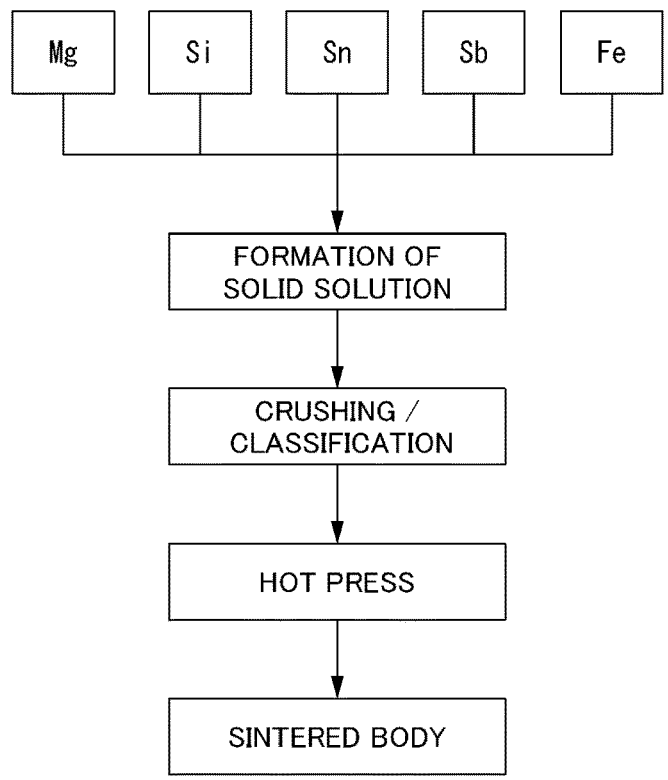
FIG. 2 is a view showing a procedure of a method of manufacturing a thermoelectric material.

An example of a method for manufacturing a thermoelectric material according to this embodiment will be specifically described. FIG. 2 is a flowchart showing a procedure of a method of manufacturing a thermoelectric material according to this embodiment.

Initially, an Mg simple substance, a Si simple substance and a Sn simple substance are weighed according to the composition ratio. A Sb simple substance and a Fe simple substance are weighed according to the additive amounts (substitution amounts). FIG. 2, shows examples when the substitution element is Sb, but when the substitution element is Bi, a Bi simple substance may be weighed instead of the Sb simple substance.

In this case, a size of Mg is preferably 3 to 5 mm. If the size is too large, Mg is difficult to melt, and as a result, there is a fear that the Mg simple substance will remain. On the other hand, if the size is too small, a surface area to be oxidized in atmosphere increases and an amount of an Mg oxide increases. Si is preferably used in a form of powder or granules, and a fine powder of about several tens of micrometers is preferable. Sn is preferably granular, and its average particle diameter may be, for example, 1 to 3 mm. It is preferable to add the substitution elements and Fe in a powder form.

Figure 3:
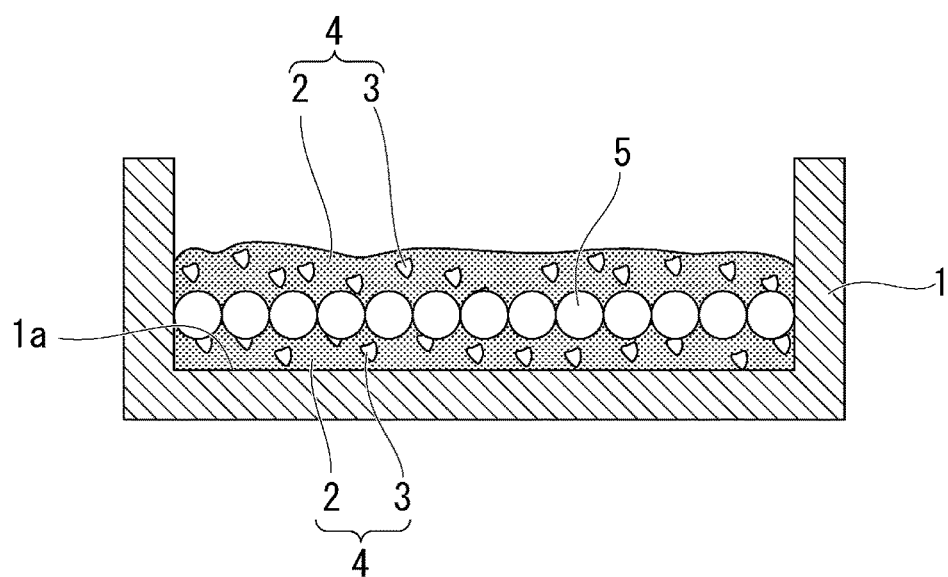
FIG. 3 is a schematic view showing a manufacturing process of a thermoelectric material.

As shown in FIG. 3, a heating member 1 is prepared. As the heating member 1, a carbon board, a crucible or the like can be used. It is desirable that the heating member 1 be pre-baked in advance.

A mixture 4 which includes a powder mixture 2 containing of Si, Fe and the substitution elements and granular Sn (reference numeral 3) are evenly spread over the bottom surface 1a of the heating member 1.

A granular Mg (reference 5) is placed on the mixture 4. It is preferable that Mg (reference numeral 5) is evenly spaced on the mixture 4. Next, an additional mixture 4 is evenly spread over the Mg (reference numeral 5).

The heating member 1 and each material contained therein are heated in a heating furnace. By this heating, a solid solution of each element is prepared. As a method of preparing the solid solution, a solid phase reaction method, a liquid-solid phase reaction method, a direct melting method, a mechanical alloying method, or the like can be used. Among these solid solution preparing methods, it is preferable to use a liquid-solid phase reaction method.

The liquid-solid phase reaction method is a method of carrying out a chemical reaction with some elements in a solid state and other elements in a molten state. This method is a simple synthesis method without problems such as composition deviation, contamination of impurities, dust explosion and the like. In the present embodiment, a reaction is carried out in a state in which Sn, Mg, Fe, and substitution elements melt to form liquids, and Si is used in a solid state.

The heating temperature is preferably 800° C. or more, for example 800 to 1100° C. The heating time can be, for example, 1 to 10 hours. With this heating temperature range, it is possible to sufficiently melt the other elements while maintaining Si in a solid state. As a result, segregation of each element can be suppressed. In addition, this heating time can sufficiently carry out the reaction.

In order to prevent oxidation of raw materials, heating is preferably performed in a non-oxidizing atmosphere. For example, it is preferable to perform the process in an inert gas atmosphere such as argon (Ar) or in a mixed gas atmosphere in which hydrogen ($H_2$) is mixed with an inert gas. Thereby, an alloy which is a solid solution containing $Mg_2Si$, $Mg_2Sn$, Fe and the substitution elements is synthesized.

The alloy is then crushed. Examples of a crushing device include a hammer mill, a jaw crusher, an impact crusher, a ball mill, an attritor, a jet mill and the like.

It is preferable to classify the obtained powder and to use one having an average particle size within a predetermined range, for example, one having an average particle diameter of 38 to 75 μm. As a classification method, there are an air flow classification method, a sieving method and the like. The average particle size may be, for example, 50% cumulative particle diameter in volume-based particle size distribution. The average particle diameter can be measured by a laser diffraction type particle size distribution meter or the like.

Next, this powder is pressed by hot pressing or the like and sintered. For example, powder is filled in a die and pressurized with a punch. The powder becomes a densified sintered body by pressurization. Besides hot pressing, HIP, plasma sintering and the like are available as the sintering method.

The temperature condition at the time of sintering is preferably 600 to 800° C. The pressurizing condition (pressing pressure) is preferably 10 to 100 MPa. The atmosphere during sintering is preferably an inert gas atmosphere such as argon (Ar). The pressurization time can be, for example, 1 to 10 hours.

The obtained sintered body is a thermoelectric material excellent in properties as an n-type thermoelectric material. The sintered body can be cut into a predetermined size according to the purpose and polished, and then thermoelectric characteristics can be measured.

EXAMPLE

Example 1

Mg particles (purity 99.9%), Si powder (99.9999%), Sn powder (99.999%), Sb particles (99.999%), Fe powder (99.99%) were prepared as raw materials. These raw materials were weighed and placed in a carbon boat and put into a synthesis furnace to prepare an alloy comprising a solid solution. The alloy containing this solid solution was prepared by a liquid-solid phase reaction synthesis method. The synthesis temperature was 1103 K (830° C.), the synthesis time was 4 hours, and the reaction atmosphere was Ar+3% $H_2$ reducing atmosphere.

Subsequently, the obtained alloy was crushed to classify the particle diameter d to a range of 38 μm≤d≤75 μm. The classified powder was sintered by hot pressing to prepare a sintered body. The sintering temperature of the sintered body was 1043K (770° C.), the sintering time was 5 hours, the sintering pressure was 80 MPa, and the reaction atmosphere was Ar atmosphere.

A compound, in which at least one of the Si site and the Sn site of the compound represented by $Mg_2Si_{0.50}Sn_{0.50}$ was replaced by 10000 ppm of Sb, and 20000 ppm of Fe was added (hereinafter referred to as "$Mg_2Si_{0.50}Sn_{0.50}$+Sb10000 ppm+Fe20000 ppm"), was obtained.

Example 2

The compound ($Mg_2Si_{0.50}Sn_{0.50}$+Sb10000 ppm+Fe20000 ppm) obtained in Example 1 was heated in an Ar atmosphere at 500° C. for 24 hours.

Comparative Example 1

Comparative Example 1 is different from Example 1 in that no Fe powder was added. That is, in Comparative Example 1, a compound in which at least one of the Si site and the Sn site of the compound represented by $Mg_2Si_{0.50}Sn_{0.50}$ was replaced with Sb of 10000 ppm (hereinafter referred to as "$Mg_2Si_{0.50}Sn_{0.50}$+Sb10000 ppm") was obtained.

Comparative Example 2

A compound ($Mg_2Si_{0.50}Sn_{0.50}$+Sb10000 ppm) obtained in Comparative Example 1 was heated in an Ar atmosphere at 500° C. for 24 hours.

Example 3

In the present example, a compound ($Mg_2Si_{0.50}Sn_{0.50}$+Sb10000 ppm+Fe5000 ppm) obtained in the same manner as in Example 1 except that 5000 ppm of Fe was added was heated in an Ar atmosphere at 500° C. for 24 hours.

Example 4

In the present example, a compound ($Mg_2Si_{0.50}Sn_{0.50}$+Sb10000 ppm+Fe10000 ppm) obtained in the same manner as in Example 1 except that 10,000 ppm of Fe was added was heated in Ar atmosphere at 500° for 24 hours.

Example 5

In the present example, a compound ($Mg_2Si_{0.50}Sn_{0.50}$+Sb10000 ppm+Fe50000 ppm) obtained in the same manner as in Example 1 except that 50000 ppm of Fe was added was heated at 500° C. in an Ar atmosphere for 24 hours.

Example 6

In this Example, a compound was obtained in the same manner as in Example 1 except that Bi was added instead of Sb as a raw material. In the compound, at least one of the Si site and the Sn site of the compound represented by $Mg_2Si_{0.50}Sn_{0.50}$ was replaced with 10,000 ppm of Bi and 20000 ppm of Fe was added (hereinafter referred to as "$Mg_2Si_{0.50}Sn_{0.50}$+Bi10000 ppm+Fe20000 ppm").

Example 7

The compound ($Mg_2Si_{0.50}Sn_{0.50}$+Bi10000 ppm+Fe20000 ppm) obtained in Example 6 was heated in an Ar atmosphere at 500° C. for 24 hours.

Comparative Example 3

Comparative Example 3 was different from Example 6 in that no Fe powder was added. That is, in Comparative Example 3, a compound in which at least one of the Si site and the Sn site of the compound represented by $Mg_2Si_{0.50}Sn_{0.50}$ was replaced with 10000 ppm of Bi (hereinafter referred to as "$Mg_2Si_{0.50}Sn_{0.50}$+Bi10000 ppm").

Comparative Example 4

The compound ($Mg_2Si_{0.50}Sn_{0.50}$+Bi10000 ppm) obtained in Comparative Example 3 was heated in an Ar atmosphere at 500° C. for 24 hours.

Example 8

In the present example, a compound was obtained in the same manner as in Example 1 except that raw materials were weighed so as to be $Mg_{2.05}Si_{0.40}Sn_{0.60}$ instead of $Mg_2Si_{0.50}Sn_{0.50}$. In the compound, at least one of the Si site and the Sn site of the compound represented by $Mg_{2.05}Si_{0.40}Sn_{0.60}$ was replaced with 10000 ppm of Sb and 20000 ppm of Fe was added (hereinafter referred to as "$Mg_{2.05}Si_{0.40}Sn_{0.60}$+Sb10000 ppm+Fe20000 ppm").

Example 9

The compound ($Mg_{2.05}Si_{0.40}Sn_{0.60}$+Sb10000 ppm+Fe20000 ppm) obtained in Example 8 was heated in an Ar atmosphere at 500° C. for 24 hours.

Comparative Example 5

Comparative Example 5 was different from Example 8 in that no Fe powder was added. That is, in Comparative Example 5, a compound in which at least one of the Si site and the Sn site of the compound represented by $Mg_{2.05}Si_{0.40}Sn_{0.60}$ was replaced with 10000 ppm of Sb (hereinafter referred to as "$Mg_{2.05}Si_{0.40}Sn_{0.60}$+Sb10000 ppm").

Comparative Example 6

The compound ($Mg_{2.05}Si_{0.40}Sn_{0.60}$+Sb10000 ppm) obtained in Comparative Example 5 was heated in an Ar atmosphere at 500° for 24 hours.

(Measurement of Electrical Resistivity)

The electrical resistivities of the thermoelectric materials prepared in Examples and Comparative Examples were measured, respectively. The electrical resistivities were measured using a four-terminal sensing with direct current. FIGS. 4, 9, 14, and 18 are the measurement results of the electrical resistivities of the examples and the comparative examples. The horizontal axis represents the temperature at the time of measurement, and the vertical axis represents the electrical resistivity.

Figure 4:
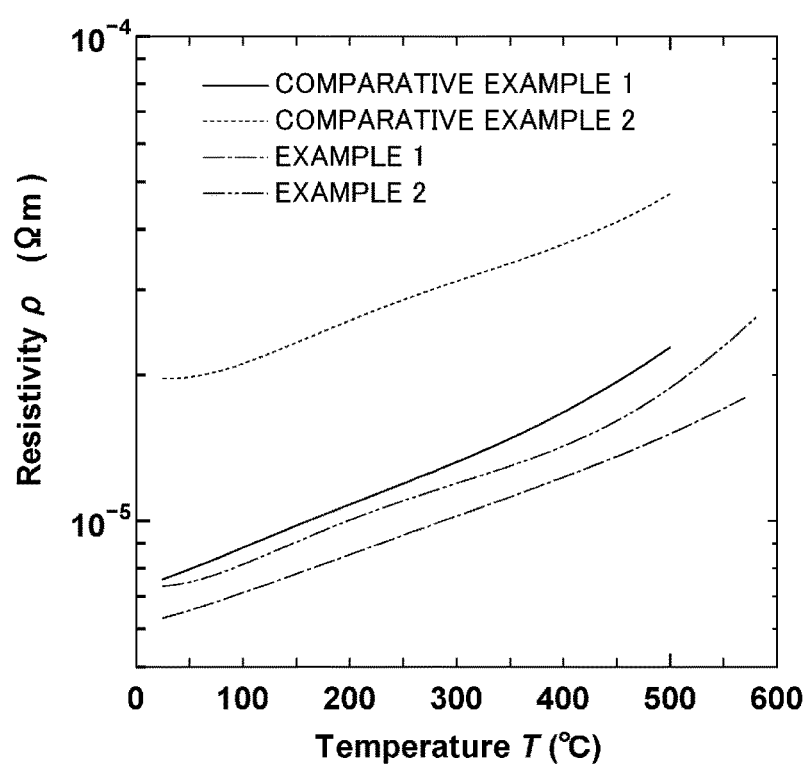
FIG. 4 shows measurement results of electrical resistivity ρ of Examples 1 and 2 and Comparative Examples 1 and 2.

As shown in FIG. 4, in Examples 1 and 2 in which Fe was added, the electrical resistivities were smaller than those of Comparative Examples 1 and 2 in which Fe was not added. In the room temperature environment, the electrical resistivity of Example 1 in which Fe was added was $6.29 \times 10^{-6}$ Ωn, and the electrical resistivity of Comparative Example 1 in which no Fe was added was $7.59 \times 10^{-6}$ Ωm. That is, the electrical resistivity of Example 1 was reduced by 17% with respect to the electrical resistivity of Comparative Example 1 under the room temperature environment.

In addition, the electrical resistivity of Comparative Example 2 was significantly higher than the electrical resistivity of Comparative Example 1 by heating at 500° C. for 24 hours. Under the room temperature environment, the electrical resistivity of Comparative Example 1 is $7.59 \times 10^{-6}$ Ωm, and the electrical resistivity of Comparative Example 2 is $1.96 \times 10^{-5}$ Ωm. That is, the electrical resistivity increased by 158% more in the comparison of before and after the heat treatment. This tendency was the same in other temperature ranges.

On the other hand, the electrical resistivity of Example 2 did not greatly increase from the electrical resistivity of Example 1 even when heat treatment was performed at 500° C. for 24 hours. Under the room temperature environment, the electrical resistivity of Example 1 was $6.29 \times 10^{-6}$ Ωm, and the electrical resistivity of Example 2 was $7.28 \times 10^{-6}$ Ωm. That is, the electrical resistivity increased only by about 15% before and after the heat treatment. This tendency was the same in other temperature ranges. As indicated by the general formula (1), the electrical resistivity greatly affects the dimensionless figure-of-merit ZT representing the thermoelectric characteristics of thermoelectric materials. The fact that the electrical resistivity did not largely fluctuate by the heat treatment means that the thermoelectric characteristic was stabilized against heat, which means that the thermoelectric material has excellent heat resistance.

Figure 9:
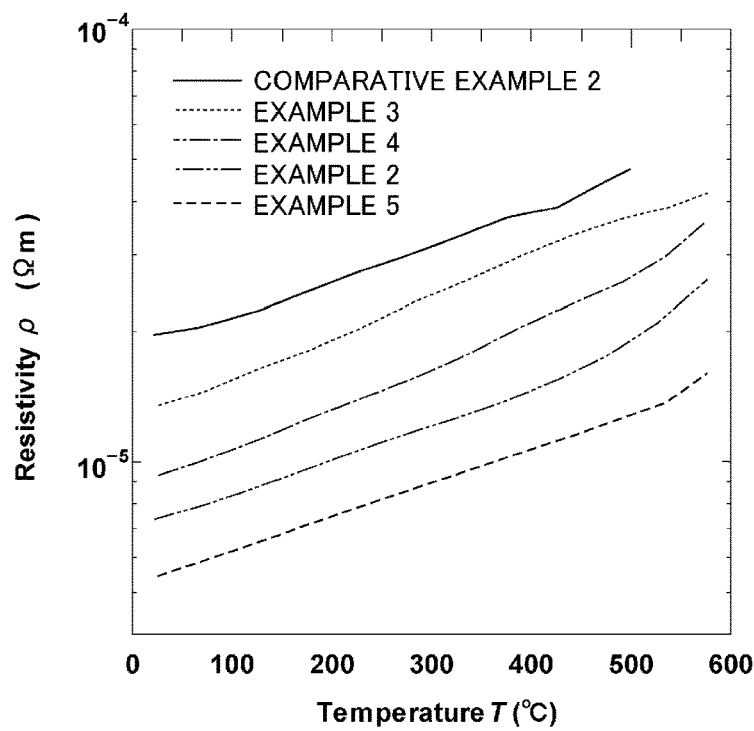
FIG. 9 shows measurement results of electrical resistivity ρ of Examples 2 to 5 and Comparative Example 2.
Figure 14:
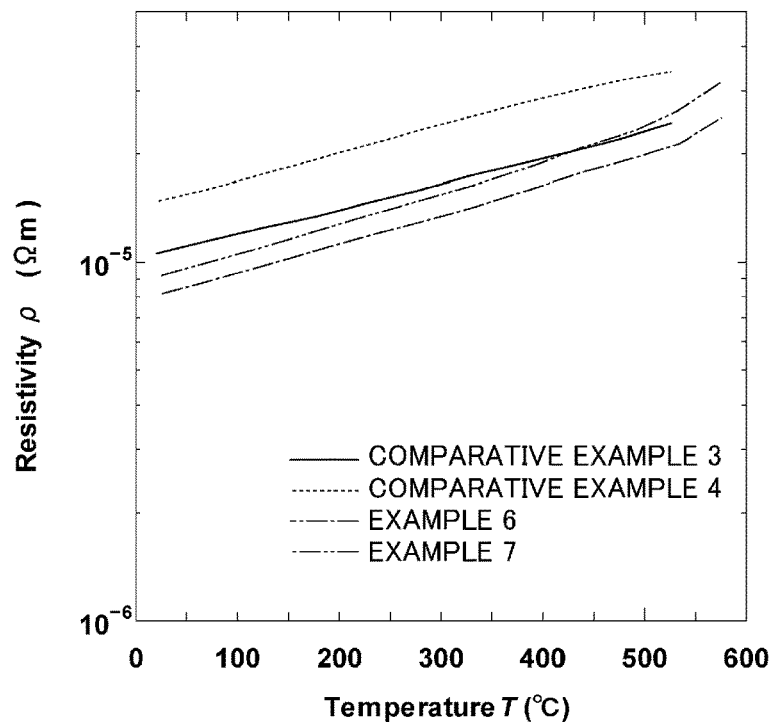
FIG. 14 shows measurement results of electrical resistivity ρ of Examples 6 and 7 and Comparative Examples 3 and 4.
Figure 18:
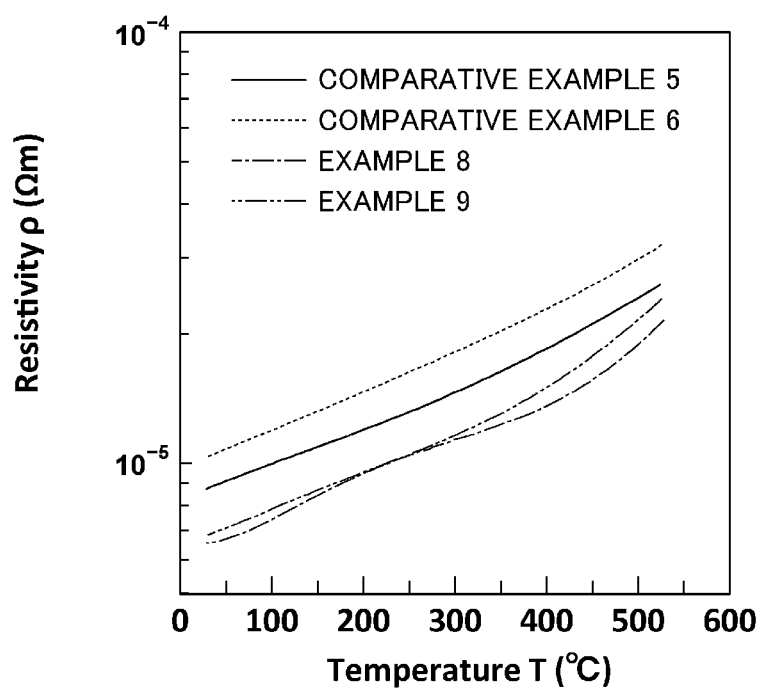
FIG. 18 shows measurement results of electrical resistivity ρ of Examples 8 and 9 and Comparative Examples 5 and 6.

Further, as shown in FIG. 9, the electrical resistivity decreased as the amount of added Fe increased. FIGS. 14 and 18 show the same results as in FIG. 4.

(Measurement of Seebeck Coefficient)

Parameters other than electrical resistivity that influence the dimensionless figure-of-merit ZT were also measured. The Seebeck coefficient of the examples and comparative examples was measured as one of the parameters. The Seebeck coefficient at room temperature was obtained with a temperature difference within 2K. Thermal electromotive force was calculated and the temperature dependency was measured using the large temperature difference method.

FIGS. 5, 10, 15, and 19 are measurement results of Seebeck coefficients of Examples and Comparative Examples, wherein the horizontal axis represents the temperature at the time of measurement and the vertical axis represents the Seebeck coefficient.

Figure 5:
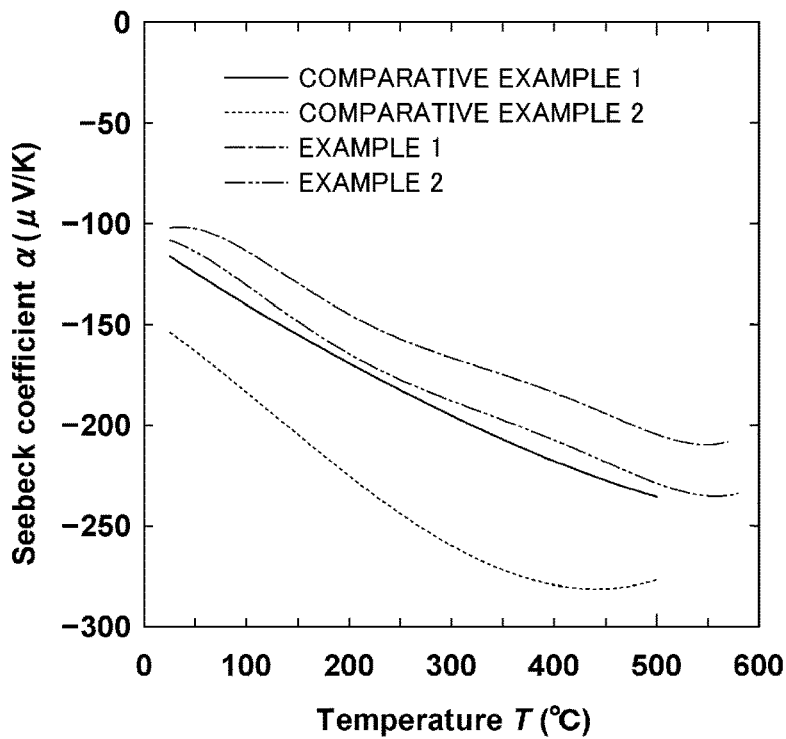
FIG. 5 shows measurement results of Seebeck coefficient α of Examples 1 and 2 and Comparative Examples 1 and 2.

As shown in FIG. 5, when Examples 1 and 2 in which Fe was added and Comparative Example 1 in which no Fe was added, the Seebeck coefficient was not greatly different.

In the example in which Fe was added, the Seebeck coefficient was not largely fluctuated before and after the heat treatment (Examples 1 and 2), whereas in the comparative example in which no Fe was added, the Seebeck coefficient largely fluctuated before and after heating (Comparative Example 1 and Comparative Example 2).

As shown in the general formula (1), the Seebeck coefficient also had a large influence on the dimensionless figure-of-merit ZT representing the thermoelectric characteristics of the thermoelectric material. The fact that the Seebeck coefficient did not fluctuate greatly due to the heat treatment is because thermoelectric characteristics was stabilized against heat, which means that the thermoelectric material has excellent heat resistance.

Figure 10:
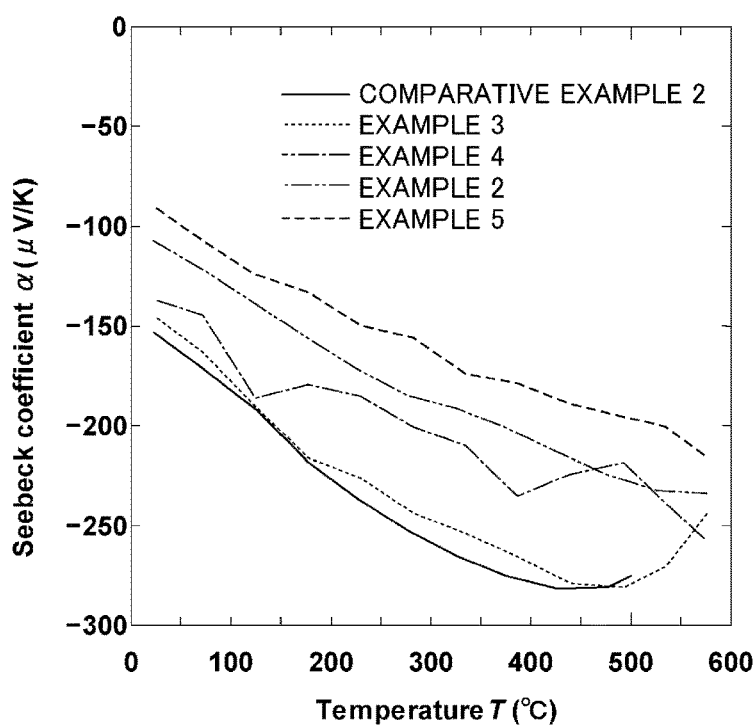
FIG. 10 shows measurement results of Seebeck coefficient α of Examples 2 to 5 and Comparative Example 2.
Figure 15:
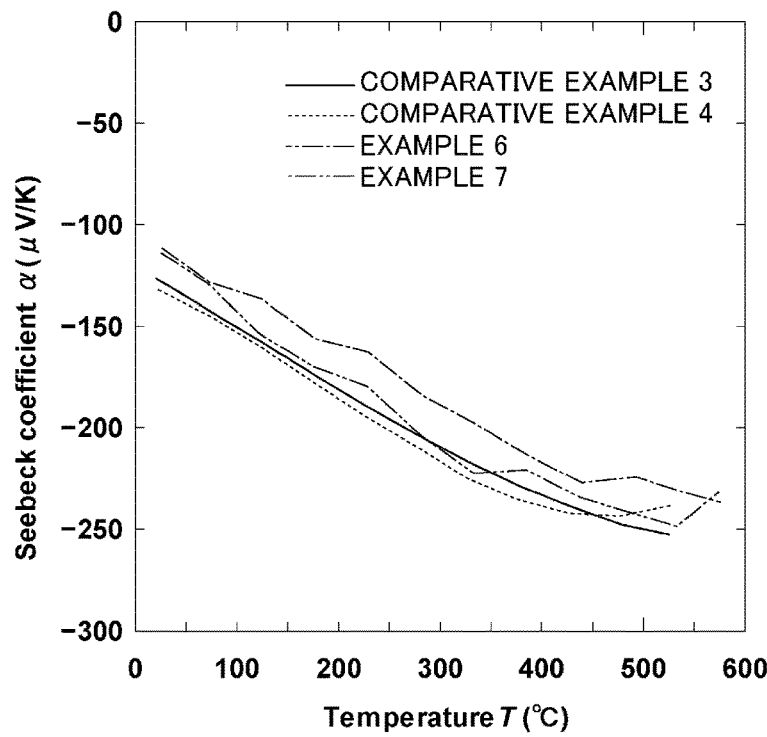
FIG. 15 shows measurement results of the Seebeck coefficient α of Examples 6 and 7 and Comparative Examples 3 and 4.
Figure 19:
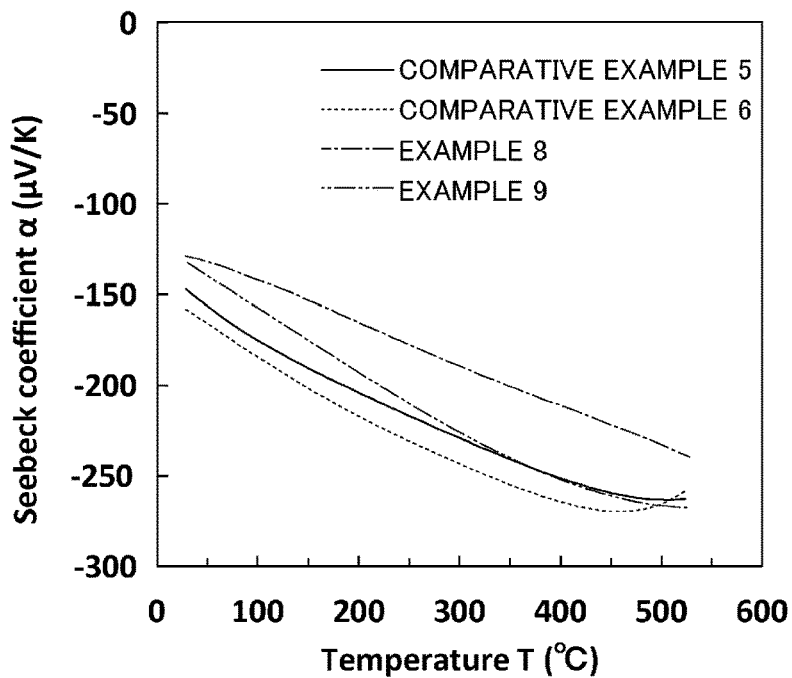
FIG. 19 shows measurement results of the Seebeck coefficient α of Examples 8 and 9 and Comparative Examples 5 and 6.

Also, as shown in FIG. 10, the Seebeck coefficient increased as the additive amount of Fe increased, and FIGS. 15 and 19 showed similar results to FIG. 5.

(Measurement of Thermal Conductivity)

Next, the thermal conductivity of each of Examples and Comparative Examples was measured as one of the parameters affecting the dimensionless figure-of-merit ZT.

The thermal conductivity was measured using a static comparison method with quartz (κ=1.37 W/mK) and a temperature dependence of thermal conductivity was measured by laser flash method (ULVAC Riko Co., Ltd; TC-7000). And the results are shown in FIGS. 6, 11, 16 and 20. The horizontal axis indicates the temperature at the time of measurement and the vertical axis indicates the thermal conductivity.

Figure 6:
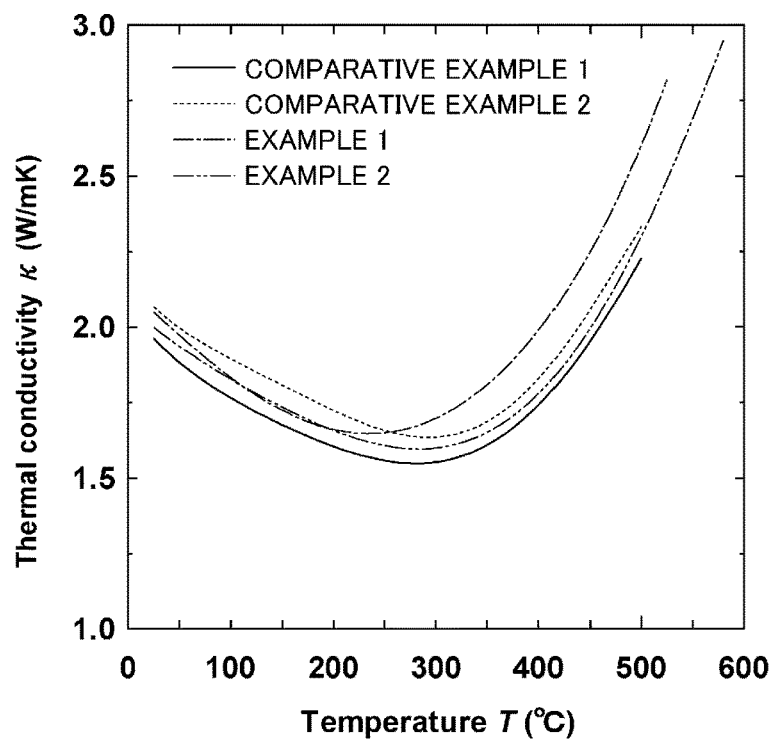
FIG. 6 shows measurement results of thermal conductivity κ of Examples 1 and 2 and Comparative Examples 1 and 2.

As shown in FIG. 6, there was no significant difference in thermal conductivity when comparing the thermal conductivities of Examples 1 and 2 in which Fe was added and that of Comparative Example 1 in which no Fe was added. In any of the comparative examples, no large fluctuation in the thermal conductivity was observed before and after the heat treatment.

Figure 11:
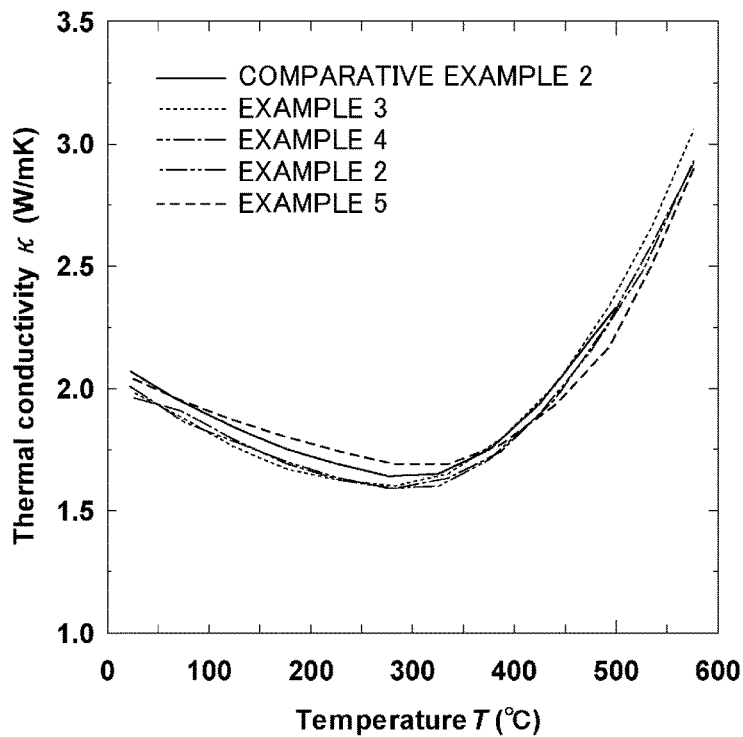
FIG. 11 shows measurement results of thermal conductivity κ in Examples 2 to 5 and Comparative Example 2.
Figure 16:
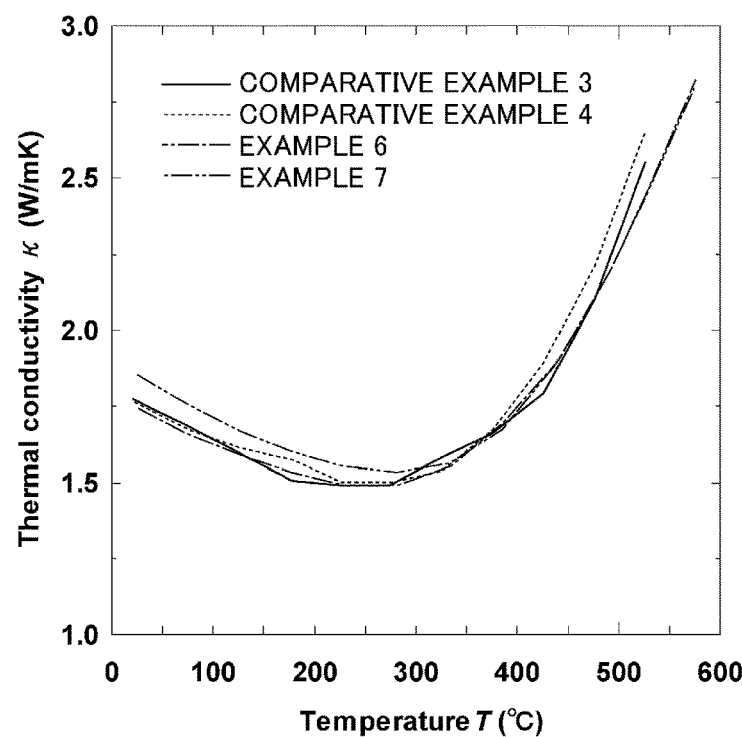
FIG. 16 shows measurement results of thermal conductivity κ of Examples 6 and 7 and Comparative Examples 3 and 4.
Figure 20:
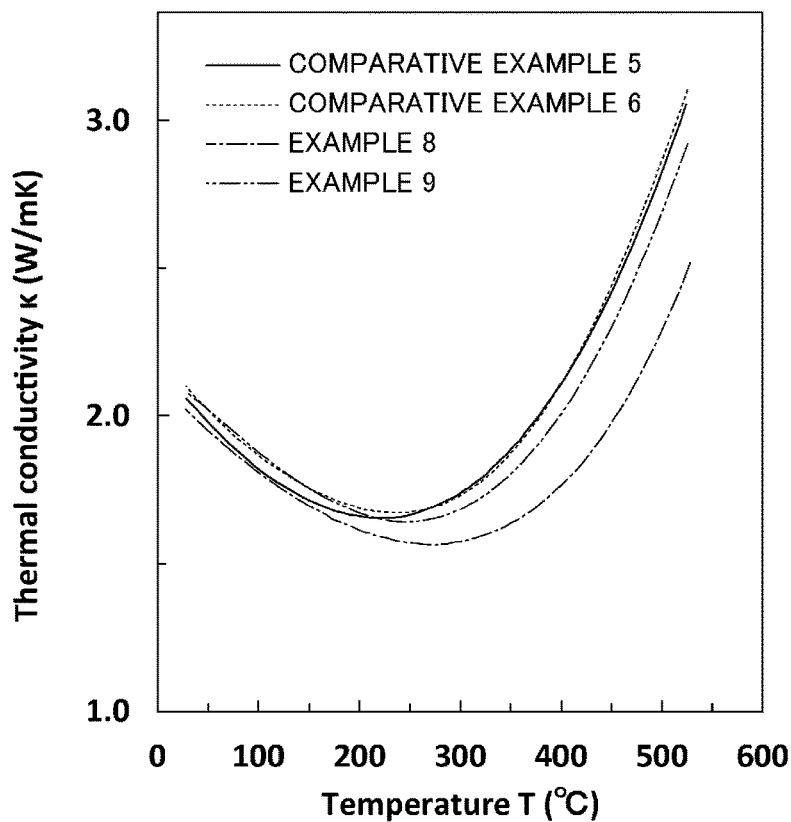
FIG. 20 shows measurement results of thermal conductivity κ of Examples 8 and 9 and Comparative Examples 5 and 6.

Further, FIGS. 11, 16, 20 showed similar results as FIG. 6.

Figure 21:
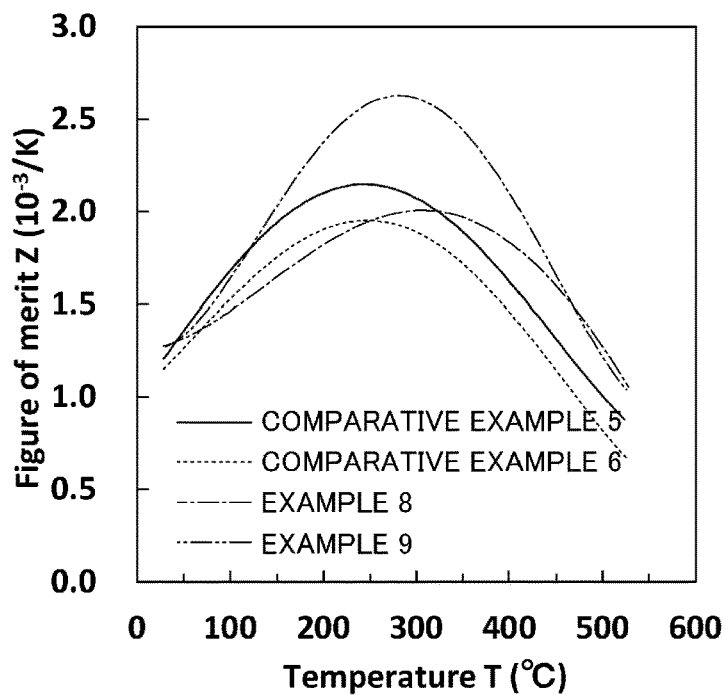
FIG. 21 shows measurement results of a figure-of-merit Z of Examples 8 and 9 and Comparative Examples 5 and 6.
Figure 22:
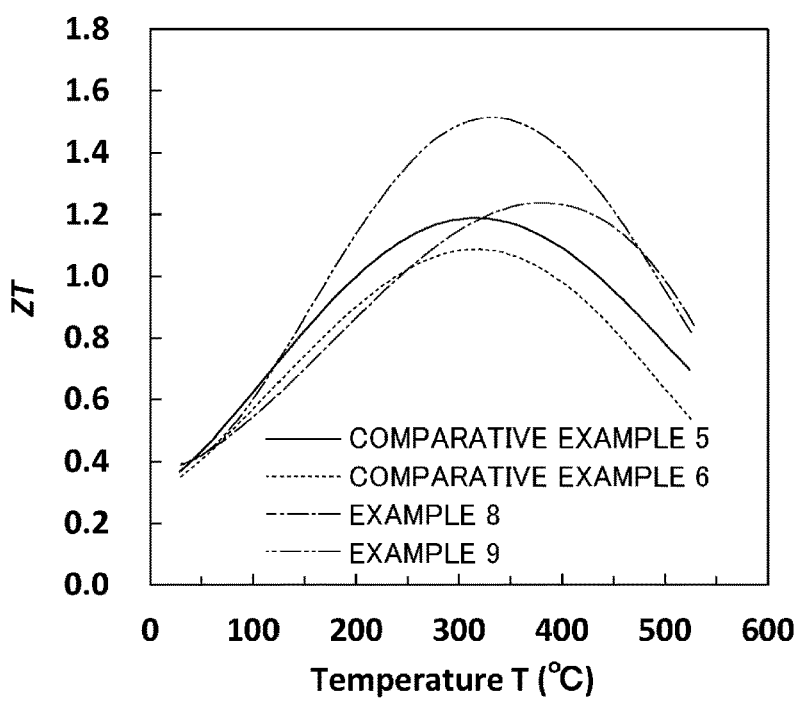
FIG. 22 shows measurement results of the dimensionless figure-of-merit ZT of Examples 8 and 9 and Comparative Examples 5 and 6.

(Measurement of Dimensionless Figure-of-Merit) The dimensionless figure-of-merit, which was obtained by multiplying the figure-of-merit Z of the thermoelectric material by the absolute temperature, is generally written as ZT. ZT may be obtained by using the thermal conductivity, the electrical resistivity and the Seebeck coefficient, which were measured above, FIGS. 7, 12, 17, and 21 are the calculation results of the figure-of-merit Z of the examples and the comparative examples, and FIGS. 8, 13, and 22 are the calculation results of the dimensionless figure-of-merit ZT of the examples and the comparative examples. FIGS. 7, 12, 17, and 21 are values before absolute temperature was applied and are shown as one index.

Figure 7:
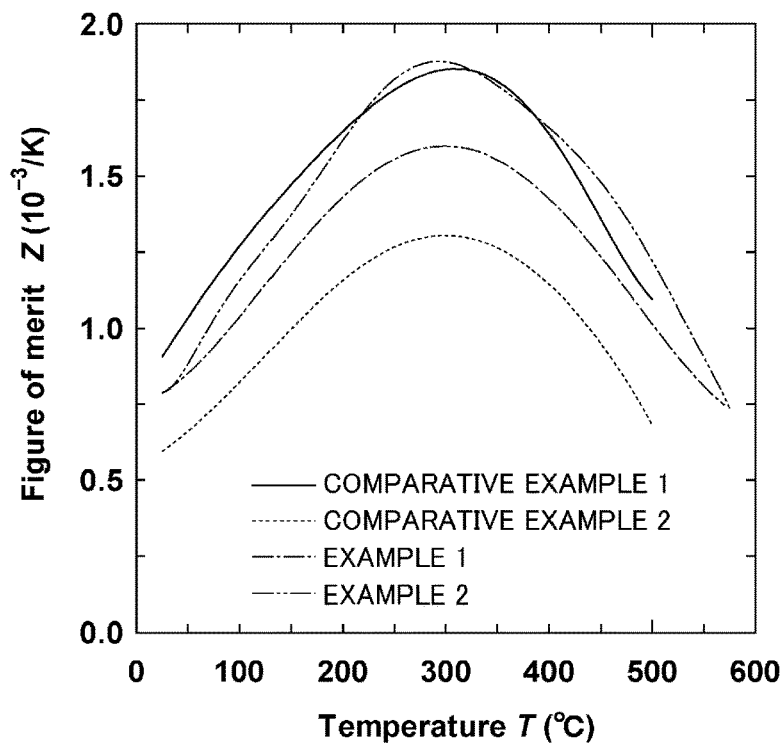
FIG. 7 shows measurement results of a figure-of-merit Z of Examples 1 and 2 and Comparative Examples 1 and 2.
Figure 8:
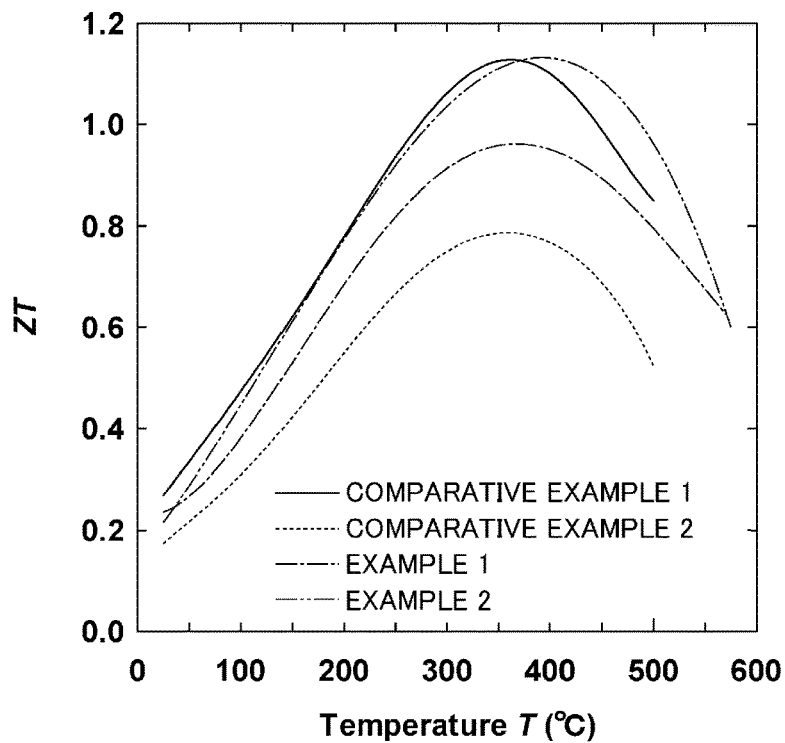
FIG. 8 shows measurement results of the dimensionless figure-of-merit ZT of Examples 1 and 2 and Comparative Examples 1 and 2.

As shown in FIG. 7, the figure-of-merit Z of Example 2 in which Fe was added was the maximum value. The figure-of-merit Z of Example 2 after the heat treatment was increased as compared with that before the heat treatment. In contrast, the figure-of-merit Z of Comparative Example 2 after heating is lower than that before the heat treatment.

As shown in FIG. 8, the maximum value of ZT in Example 2 in which Fe was added was 1.1. When comparing Example 2 after heat treatment and Comparative Example 1 before heat treatment, Example 2 shows the same thermoelectric performance as Comparative Example 1 to which iron is not added. Particularly, in the temperature range of 380° C. or higher, the thermoelectric performance of Example 2 is superior to the thermoelectric performance of Comparative Example 1.

In addition, the compound ($Mg_2Si_{0.50}Sn_{0.50}$+Sb10000 ppm+Fe20000 ppm) shown in the examples showed an increase in thermoelectric performance before and after heating, unlike the compound ($Mg_2Si_{0.50}Sn_{0.50}$+Sb10000 ppm) shown in Comparative Examples.

In the compound ($Mg_2Si_{0.50}Sn_{0.50}$+Sb10000 ppm+Fe20000 ppm), the ZT before heating increased from 0.9 (Example 1) to 1.1 (Example 2). That is, the thermoelectric performance after the heat treatment increased to 120% in comparison with that before the heat treatment.

In contrast, the compound ($Mg_2Si_{0.50}Sn_{0.50}$+Sb10000 ppm) had a ZT decrease from 1.1 (Comparative Example 1) before heating to 0.75 (Comparative Example 2). That is, the thermoelectric performance after the heat treatment decreased to about 68% in comparison with that before the heat treatment.

Figure 12:
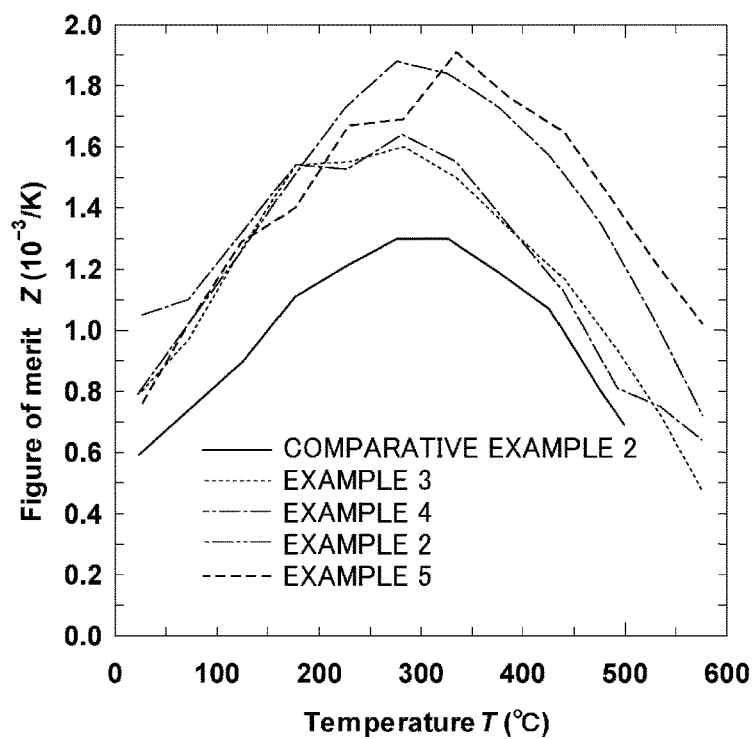
FIG. 12 shows measurement results of a figure-of-merit Z of Examples 2 to 5 and Comparative Example 2.
Figure 13:
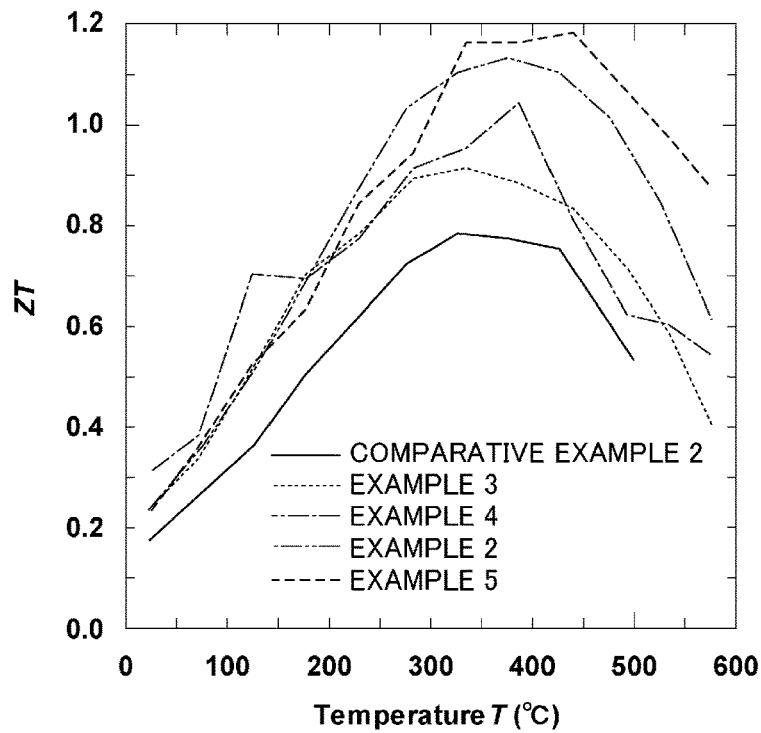
FIG. 13 shows measurement results of the dimensionless figure-of-merit ZT of Examples 2 to 5 and Comparative Example 2.
Figure 17:
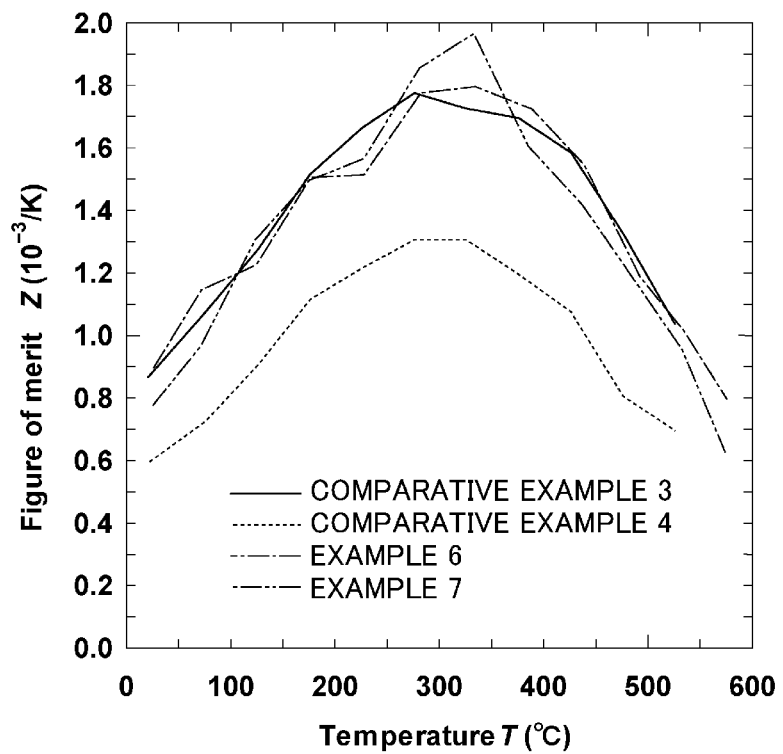
FIG. 17 shows measurement results of a figure-of-merit Z of Examples 6 and 7 and Comparative Examples 3 and 4.

As shown in FIG. 12, as the additive amount of Fe increased, the figure-of-merit Z increased. As shown in FIG. 13, ZT increased as the additive amount of Fe increased. FIGS. 17 and 21 show results similar to those in FIG. 7. FIG. 22 shows the same results as FIG. 8.

By adding iron to the thermoelectric material, the effect of increasing the thermoelectric performance by heating was obtained. It is mainly because the electrical resistivity became an appropriate value by heating. By adding iron to the specified thermoelectric material, it is possible to obtain a thermoelectric material excellent in heat resistance with less degradation of thermoelectric characteristics even in a high temperature environment.

EXPLANATION OF SIGN

1: Heating member,
1*a*: Bottom surface,
2: Powder mixture,
3: Sn,
4: Mixture,
5: Mg

The invention claimed is:

1. A thermoelectric material, which comprises:
   Fe in an amount of 20000 ppm by mole or more and 30000 ppm by mole or less, and
   a compound represented by a chemical formula $Mg_2Si_{1-x}Sn_x$ (0.35<x<0.65) wherein at least one of the Si site and the Sn site of the compound is replaced with at least one of Sb and Bi.

2. The thermoelectric material according to claim 1, wherein an amount of the at least one of Sb and Bi replacing the at least one of the Si site and the Sn site is 1000 ppm by mole or more and 30000 ppm by mole or less.

3. The thermoelectric material according to claim 2, wherein the at least one of the Si site and the Sn site is replaced with Sb, and the amount of Sb is 5000 ppm by mole or more and 15000 ppm by mole or less.

4. The thermoelectric material according to claim 2, wherein the at least one of the Si site and the Sn site is replaced with Bi, and the amount of Bi is 1000 ppm by mole or more and 15000 ppm by mole or less.

\* \* \* \* \*